(12) United States Patent
Velez et al.

(10) Patent No.: US 10,490,348 B2
(45) Date of Patent: Nov. 26, 2019

(54) TWO-DIMENSIONAL STRUCTURE TO FORM AN EMBEDDED THREE-DIMENSIONAL STRUCTURE

(71) Applicant: QUALCOMM Incorporated, San Diego, CA (US)

(72) Inventors: Mario Francisco Velez, San Diego, CA (US); Daeik Daniel Kim, Del Mar, CA (US); Niranjan Sunil Mudakatte, San Diego, CA (US); David Francis Berdy, San Diego, CA (US); Changhan Hobie Yun, San Diego, CA (US); Jonghae Kim, San Diego, CA (US); Chengjie Zuo, San Diego, CA (US); Yunfei Ma, Ithaca, NY (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 310 days.

(21) Appl. No.: 15/192,802

(22) Filed: Jun. 24, 2016

(65) Prior Publication Data
US 2017/0372831 A1 Dec. 28, 2017

(51) Int. Cl.
*H01F 5/00* (2006.01)
*H01F 41/04* (2006.01)
(Continued)

(52) U.S. Cl.
CPC ....... *H01F 41/041* (2013.01); *H01F 17/0013* (2013.01); *H01F 17/0033* (2013.01);
(Continued)

(58) Field of Classification Search
CPC .............. H01F 27/2804; H01F 41/041; H01F 2057/002; H01F 17/0006; H01F 2017/004;
(Continued)

(56) References Cited

U.S. PATENT DOCUMENTS 5,055,816 A * 10/1991 Altman ............... H01F 17/0033
29/602.1
5,576,680 A * 11/1996 Ling ................... H01F 17/0033
257/E21.022
(Continued)

*Primary Examiner* — Elvin G Enad
*Assistant Examiner* — Joselito Baisa
(74) *Attorney, Agent, or Firm* — Muncy, Geissler, Olds & Lowe, P.C./Qualcomm

(57) ABSTRACT

Disclosed is an apparatus including a plurality of vias each having a defined shape, wherein each of the plurality of vias includes a first two-dimensional conductive layer plated on a first side of a substrate, the first two-dimensional conductive layer having the defined shape, a second two-dimensional conductive layer plated on a second side of the substrate, the second two-dimensional conductive layer having the defined shape, and a via conductively coupling the first two-dimensional conductive layer to the second two-dimensional conductive layer. The apparatus further includes a plurality of interconnects configured to conductively couple the plurality of vias, wherein the first two-dimensional conductive layer and the second two-dimensional conductive layer of each of the plurality of vias are perpendicular to the plurality of interconnects.

21 Claims, 8 Drawing Sheets

(51) Int. Cl.
*H01F 17/00* (2006.01)
*H01L 23/31* (2006.01)
*H01L 23/64* (2006.01)
*H01L 23/00* (2006.01)

(52) U.S. Cl.
CPC .... *H01F 2017/002* (2013.01); *H01L 23/3128* (2013.01); *H01L 23/645* (2013.01); *H01L 24/19* (2013.01); *H01L 24/24* (2013.01); *H01L 24/96* (2013.01); *H01L 2224/023* (2013.01); *H01L 2224/12105* (2013.01); *H01L 2224/24195* (2013.01); *H01L 2924/1206* (2013.01); *H01L 2924/18162* (2013.01); *H01L 2924/19042* (2013.01); *H01L 2924/19105* (2013.01)

(58) Field of Classification Search
CPC . H01L 2924/19042; H01L 2224/73265; H01L 23/5227; H01L 28/10
USPC .................. 336/200; 257/774; 438/639, 672
See application file for complete search history.

(56) References Cited

U.S. PATENT DOCUMENTS

| | | | | |
|---|---|---|---|---|
| 6,008,102 A | * | 12/1999 | Alford | H01L 23/5227 257/531 |
| 6,148,500 A | * | 11/2000 | Krone | H01F 17/0033 29/602.1 |
| 6,388,204 B1 | * | 5/2002 | Lauffer | H01R 4/26 174/255 |
| 6,580,350 B1 | * | 6/2003 | Kobayashi | H01F 17/0013 336/192 |
| 6,778,058 B1 | | 8/2004 | Branchevsky | |
| 7,125,810 B2 | * | 10/2006 | Muta | H01L 21/76898 438/758 |
| 7,384,856 B2 | * | 6/2008 | Das | H05K 1/162 438/396 |
| 8,466,769 B2 | | 6/2013 | Dalmia et al. | |
| 2007/0181994 A1 | * | 8/2007 | Fukase | H05K 1/116 257/700 |
| 2008/0157287 A1 | * | 7/2008 | Choi | H01L 21/76898 257/621 |
| 2008/0169124 A1 | * | 7/2008 | Zhang | H05K 3/423 174/262 |
| 2009/0029065 A1 | * | 1/2009 | Terada | C23C 18/2006 427/553 |
| 2013/0300529 A1 | | 11/2013 | Chang et al. | |
| 2014/0077254 A1 | * | 3/2014 | Izumisawa | H01L 29/407 257/139 |
| 2014/0104284 A1 | | 4/2014 | Shenoy et al. | |
| 2015/0130021 A1 | | 5/2015 | Kim et al. | |

* cited by examiner

TWO-DIMENSIONAL STRUCTURE TO FORM AN EMBEDDED THREE-DIMENSIONAL STRUCTURE

BACKGROUND

Aspects relate to using a two-dimensional structure to form an embedded three-dimensional structure.

Electromechanical systems (EMS) include devices having electrical and mechanical elements, transducers such as sensors and actuators, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

The demand for planar micromachined inductors that provide high inductance and have a large quality factor (or Q-factor) has greatly increased due to the proliferation of magnetic driving MEMS applications, such as magnetic microactuators, microsensors, and micropower converter devices. Inductors are ubiquitous passive analog electronic components that are used in a myriad of power regulation, frequency control, and signal conditioning applications in a range of devices including personal computers, tablet computers, and wireless mobile handsets.

Real inductors have a finite Q-factor, meaning that in addition to storing energy in an induced magnetic field, they also dissipate energy through ohmic and magnetic losses. Moreover, inductors may require large physical dimensions (on the order of millimeters) in order to achieve inductance values greater than tens of nanohenries (nH). Some inductors are fabricated with cores made of a high magnetic permeability material, which increases their inductance density. Due to challenges associated with designing and fabricating inductors with the requisite form factor, quality factor, and inductance density, inductors are often discrete components that are integrated with other discrete and integrated electronic elements at the board level.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

An apparatus according to at least one aspect disclosed herein includes a plurality of vias each having a defined shape, wherein each of the plurality of vias comprises: a first two-dimensional conductive layer plated on a first side of a substrate, the first two-dimensional conductive layer having the defined shape, a second two-dimensional conductive layer plated on a second side of the substrate, the second two-dimensional conductive layer having the defined shape, and a via conductively coupling the first two-dimensional conductive layer to the second two-dimensional conductive layer, and a plurality of interconnects configured to conductively couple the plurality of vias, wherein the first two-dimensional conductive layer and the second two-dimensional conductive layer of each of the plurality of vias are perpendicular to the plurality of interconnects.

A method for forming an embedded three-dimensional (3D) coil includes forming a plurality of vias on a substrate, wherein forming each of the plurality of vias comprises: plating a first two-dimensional conductive layer on a first side of the substrate, the first two-dimensional conductive layer having a defined shape, plating a second two-dimensional conductive layer on a second side of the substrate, the second two-dimensional conductive layer having the defined shape, and forming a via through the substrate to conductively couple the first two-dimensional conductive layer to the second two-dimensional conductive layer, and forming a plurality of interconnects to conductively couple the plurality of vias, wherein the first two-dimensional conductive layer and the second two-dimensional conductive layer of each of the plurality of vias are perpendicular to the plurality of interconnects.

An apparatus includes a plurality of vias each having a defined shape, wherein each of the plurality of vias comprises: a first two-dimensional conductive means plated on a first side of a substrate, the first two-dimensional conductive means having the defined shape, a second two-dimensional conductive means plated on a second side of the substrate, the second two-dimensional conductive means having the defined shape, and a via conductively coupling the first two-dimensional conductive means to the second two-dimensional conductive means, and a plurality of interconnects configured to conductively couple the plurality of vias, wherein the first two-dimensional conductive means and the second two-dimensional conductive means of each of the plurality of vias are perpendicular to the plurality of interconnects.

A non-transitory computer-readable medium storing computer executable code including code to cause a machine to form a plurality of vias on a substrate, wherein code to cause a machine to form each of the plurality of vias comprises code to: cause a machine to plate a first two-dimensional conductive layer on a first side of the substrate, the first two-dimensional conductive layer having a defined shape, cause a machine to plate a second two-dimensional conductive layer on a second side of the substrate, the second two-dimensional conductive layer having the defined shape, and cause a machine to form a via through the substrate to conductively couple the first two-dimensional conductive layer to the second two-dimensional conductive layer, and cause a machine to form a plurality of interconnects to conductively couple the plurality of vias, wherein the first two-dimensional conductive layer and the second two-dimensional conductive layer of each of the plurality of vias are perpendicular to the plurality of interconnects.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure will be readily obtained as the same becomes better understood by reference to the following detailed description when considered in connection with the accompanying drawings which are presented solely for illustration and not limitation of the disclosure, and in which.

DETAILED DESCRIPTION

Disclosed is an apparatus including a plurality of vias each having a defined shape, wherein each of the plurality of vias includes a first two-dimensional conductive layer plated on a first side of a substrate, the first two-dimensional conductive layer having the defined shape, a second two-dimensional conductive layer plated on a second side of the substrate, the second two-dimensional conductive layer having the defined shape, and a via conductively coupling the first two-dimensional conductive layer to the second two-dimensional conductive layer. The apparatus further includes a plurality of interconnects configured to conductively couple the plurality of vias, wherein the first two-dimensional conductive layer and the second two-dimensional conductive layer of each of the plurality of vias are perpendicular to the plurality of interconnects.

These and other aspects of the disclosure are disclosed in the following description and related drawings directed to specific aspects of the disclosure. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Figure 1A:
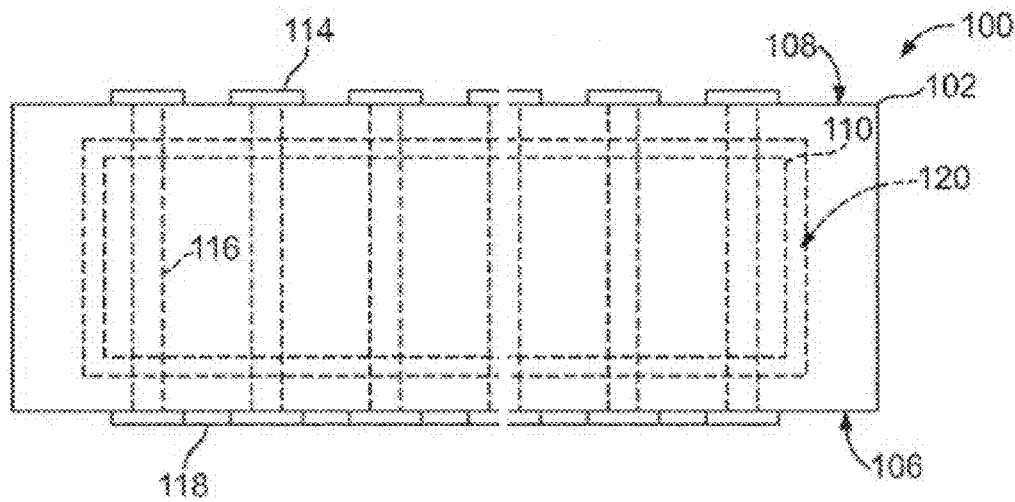
FIG. 1A is a side view of an exemplary conventional planar inductor device.

FIG. 1A is a side view of an exemplary conventional planar inductor device 100. More specifically, the inductor device 100 is a three-dimensional or solenoidal shaped inductor. The inductor device 100 includes a planar substrate 102 with one or more electronic components of the inductor device 100 embedded in the substrate 102. The substrate 102 may be a flexible and non-rigid sheet, such as a sheet of cured epoxy, or a rigid or semi-rigid board, such as a printed circuit board (PCB) formed of FR-4.

The substrate 102 includes an interior cavity 120, which may be at least partially filled with a flexible material, such as cured epoxy, or with air. The interior cavity 120 houses a ferrite body 110 surrounded by the flexible material or air. Although the ferrite body 110 is shown as having an approximately rectangular shape, the ferrite body 110 may have another shape, such as a cylinder, toroid, annulus, E-shape, and the like. The ferrite body 110 may be formed from iron, an iron alloy, or another magnetic material.

The inductor device 100 includes a plurality of interconnected upper conductors 114, conductive vias 116, and lower conductors 118. The upper conductors 114 may include conductive traces that are deposited on the upper surface 108 of the substrate 102. The lower conductors 118 may include conductive traces that are deposited on the lower surface 106 of the substrate 102. The vias 116 are formed as holes or channels that vertically extend through the substrate 102 using lasers and/or by mechanical drilling of the substrate 102. The vias 116 may be filed with a conductive material, such as a conductive solder, and/or may be conductively plated, and conductively couple the upper conductors 114 with the lower conductors 118.

Figure 1B:
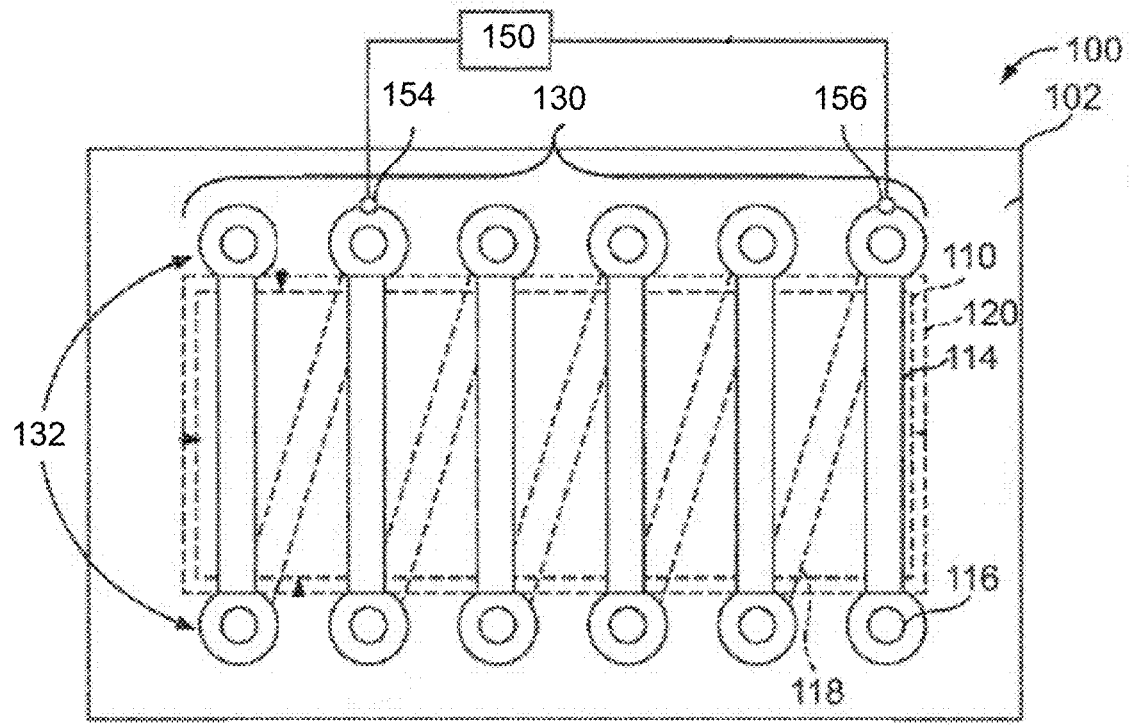
FIG. 1B is a top view of an upper surface of the exemplary conventional planar inductor device shown in FIG. 1A.

FIG. 1B is a top view of the upper surface 108 of the inductor device 100. The upper conductors 114, the lower conductors 118, and the vias 116 are arranged around the ferrite body 110 to form a conductive coil 130. For example, the vias 116 are arranged in a plurality of pairs 132, with each pair 132 including vias 116 on opposite sides of the ferrite body 110. The vias 116 in each pair 132 are conductively coupled along the upper surface 108 of the substrate 102 by one of the upper conductors 114 and along the lower surface 106 of the substrate 102 by one of the lower conductors 118. The coil 130 helically wraps around the ferrite body 110 from at or near the first end of the ferrite body 110 toward the opposite end.

The inductor device 100 may be included into or connected to an electric circuit 150 to provide an inductive element, or inductor, to the electric circuit 150. For example, two or more of the vias 116, the upper conductors 114, and/or the lower conductors 118 may be conductively coupled to conductors 154, 156 (e.g., wires, buses, terminals, contacts, or other conductive bodies) of the electric circuit 150. One conductor 154 of the electric circuit 150 can be coupled to a first via 116, upper conductor 114, or lower conductor 118 and the other conductor 156 of the circuit 150 can be coupled to a second, different via 116, upper conductor 114, or lower conductor 118.

The inductor device 100 may provide an inductive element to the electric circuit 150 that has an operator-customizable inductance characteristic. In operation, current from the circuit 150 flows through the coil 130 of the inductor device 100. At least some of the energy of the current is stored as magnetic energy in the ferrite body 110. The coil 130 may be used to delay and/or reshape currents flowing through the circuit 150, such as by filtering relatively high frequencies from the current. The amount of magnetic energy stored in the ferrite body 110 can represent an inductance characteristic of the inductor device 100. The inductance characteristic provided by the inductor device 100 may be altered by changing the lateral distance between the contacts between the conductors 154 and 156 and the coil 130. For example, the inductance of the inductor device 100 may increase when the circuit 150 is connected to vias 116 (or upper conductors 114 and/or lower conductors 118) that are farther apart from each other. Conversely, the inductance of the inductor device 100 may decrease when the circuit 150 is connected to vias 116, upper conductors 114, and/or lower conductors 118 that are disposed closer to each other.

As noted above, the vias 116 are formed as holes or channels using lasers and/or by mechanical drilling of the substrate 102. As such, vias 116 are very limited in their possible diameter and shape and are generally shaped as cylinders. This is not efficient for a solenoid-type inductor, such as inductor device 100. Accordingly, the present disclosure provides for the manufacture of vias having different shapes that can be incorporated into various devices, thereby increasing their performance. For example, as will be described further herein, curved vias manufactured as described in the present disclosure can replace vias 116 in the inductor device 100, increasing the performance of such an inductor device over the performance of the inductor device 100.

Figure 2:
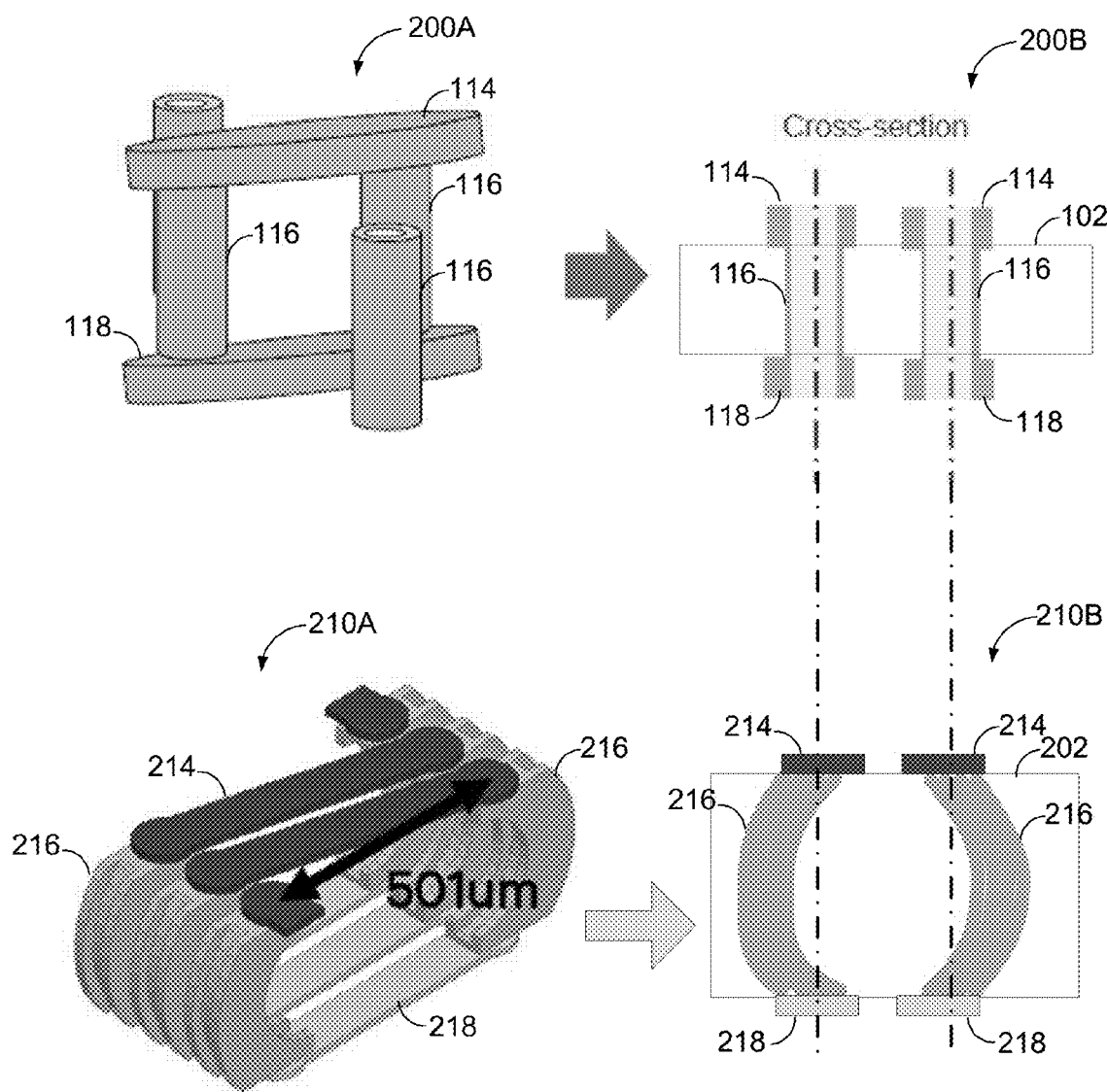
FIG. 2 illustrates a comparison of conventional vias to exemplary vias of the present disclosure.

FIG. 2 illustrates a comparison of conventional vias, such as vias 116, to exemplary vias of the present disclosure. In FIG. 2, a three-dimensional portion 200A of the inductor device 100 has a cross-section 200B. As shown in cross-section 200B, vias 116, having been drilled through substrate 102, form a rectangular aperture through substrate 102. In contrast, FIG. 2 illustrates a portion 210A of an inductor device according to an aspect of the disclosure that has a plurality of curved vias 216 conductively coupled to each other by upper conductors 214 and lower conductors 218 (similar to upper conductors 114 and lower conductors 118). The portion 210A has a cross-section 210B. As shown in cross-section 210B, vias 216 form a curved aperture through the substrate 202 (similar to substrate 102 and not shown in portion 210A).

The additional conductive material of vias 216 compared to vias 116 (due to the curve of vias 216) increases the efficiency of the inductor device of the portion 210A. In addition, as illustrated by the dashed lines in FIG. 2, the vias 216 form a larger aperture in the substrate 202 for the magnetic core of the inductor device without taking up more space on the surface of the substrate 202. In fact, due to the curve of vias 216, the upper conductors 214 and lower conductors 218 may be shorter than the upper conductors 114 and lower conductors 118, thereby taking up less space on the surface of the substrate 202 but still providing a larger aperture for the magnetic core of the inductor device.

The vias of the present disclosure can be formed in different shapes using a two-dimensional plated structure that is rotated to form a three-dimensional shaped via. More specifically, the two-dimensional plated structure comprises a first plated layer on a first side of a substrate, a via cut through the substrate in the shape of the first plated layer, and a second plated layer on the other side of the substrate having a shape matching the shape of the first plated layer. The two-dimensional plated structure is then cut out from the substrate and rotated to form a three-dimensional via.

Figure 3A:
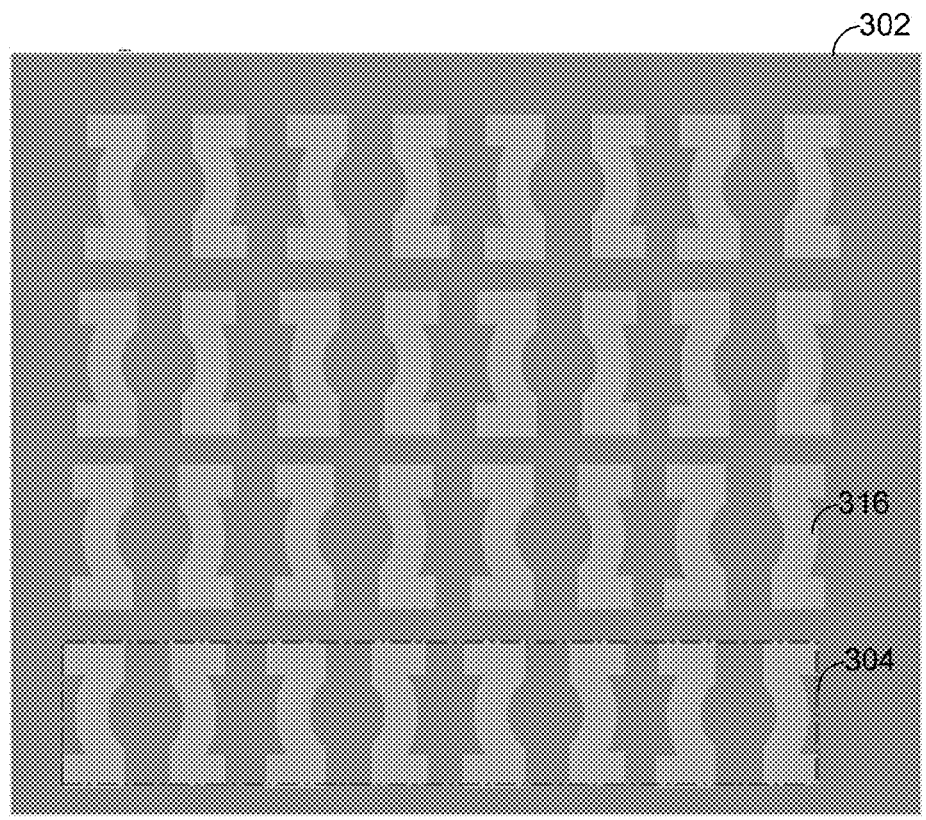
FIGS. 3A and 3B illustrate an exemplary process of forming shaped vias according to at least one aspect of the disclosure.
Figure 3A:
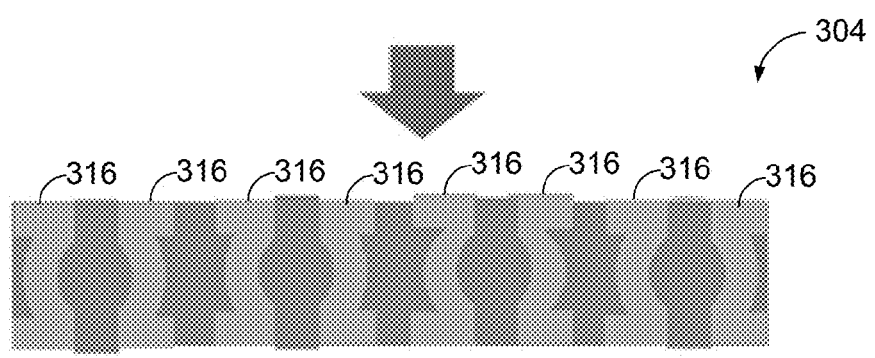
Figure 3B:
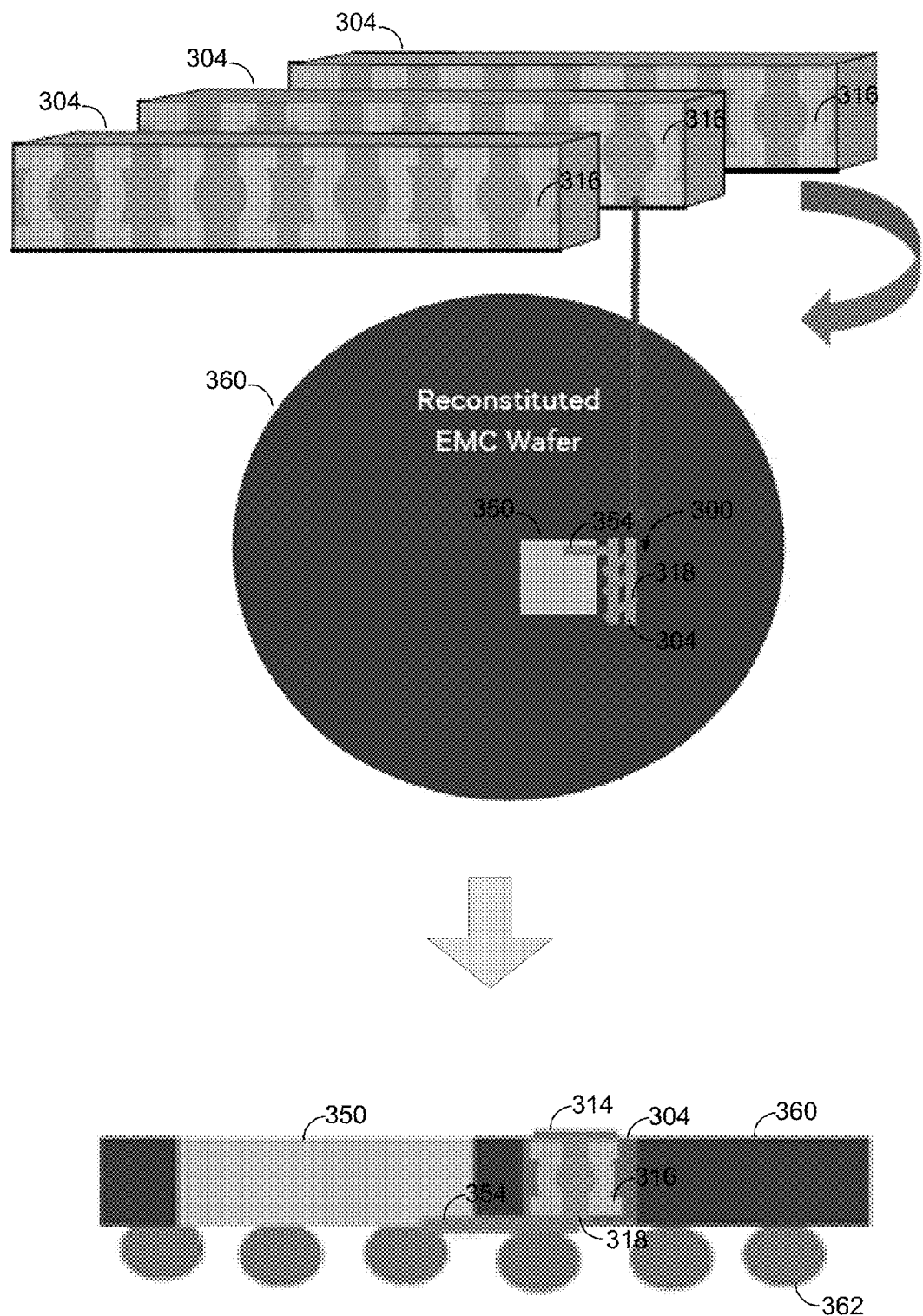
Figure 4:
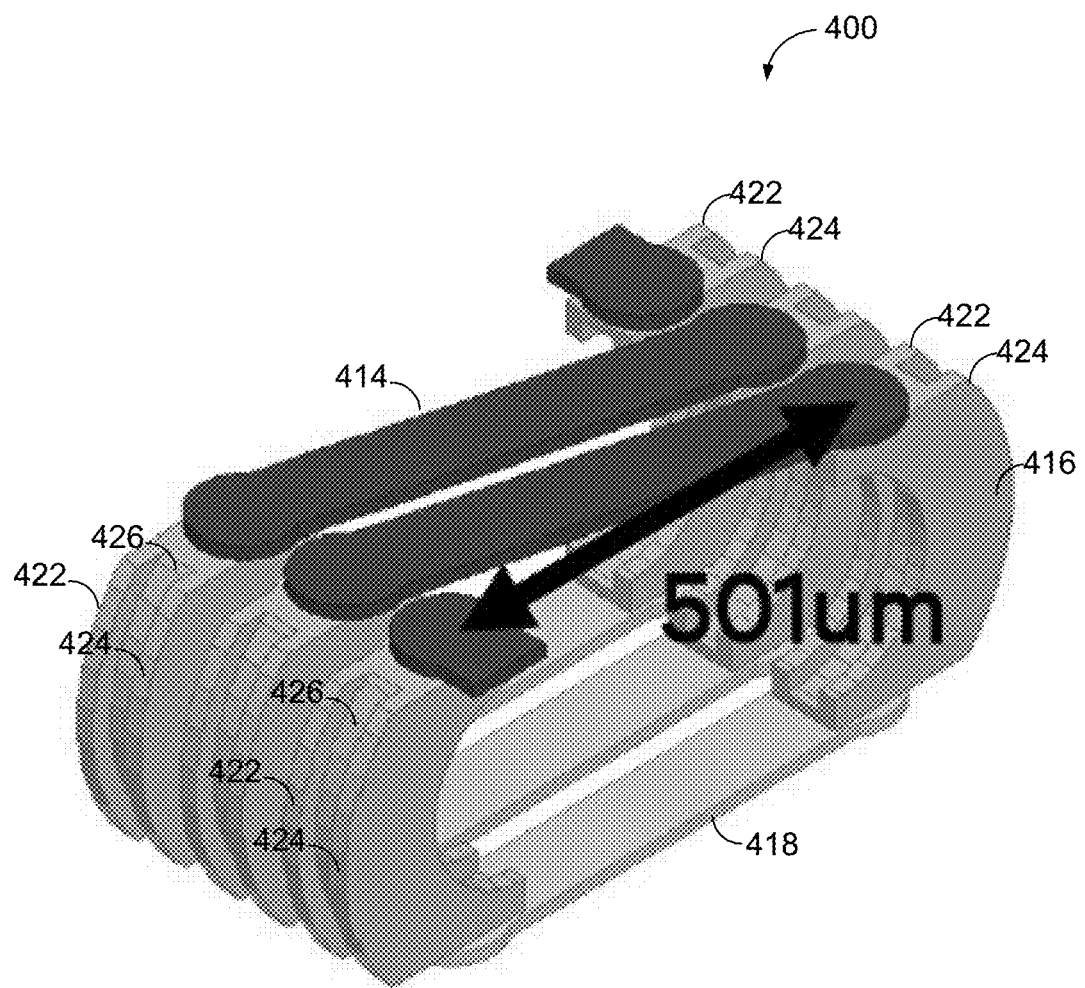
FIG. 4 illustrates a portion of an exemplary inductor device according to at least one aspect of the disclosure.

FIGS. 3A and 3B illustrate an exemplary process of forming shaped vias 316 according to at least one aspect of the disclosure. The process begins in FIG. 3A, where a plurality of shaped vias 316 are plated onto a substrate 302. Specifically, for each via 316, the shape of the via 316 is plated onto a first surface (either front or back depending on the manufacturing process) of the substrate 302, a via is cut through the substrate 302 to substantially match the shape of the via 316 plated onto the first surface of the substrate 302, and the shape of the via 316 is plated onto the other side of the substrate 302. The via connecting the plated shapes of the via 316 on the two sides of the substrate 302 may be drilled or laser cut through the substrate 302. As illustrated in FIG. 4, this via may be drilled or cut to have a shape similar to but slightly smaller than the shape of the via 316.

Although FIG. 3A illustrates the vias 316 as having a particular curved shape, it will be appreciated that any number of shapes are possible. Similarly, while FIG. 3A illustrates mirrored pairs of vias 316 to be incorporated into an inductor device, it will be appreciated that the vias 316 need not be designed as pairs. Further, although FIG. 3A illustrates each via 316 as having the same general shape (i.e., either a first shape or the mirror shape), it will be appreciated that the different vias 316 may have different shapes, provided the corresponding plated shape of the via 316 on the other side of the substrate 302 has a matching shape. In addition, although FIG. 3A illustrates the substrate 302 as having sixteen pairs of vias 316, it will be appreciated that there may be any number of vias 316, limited only by the size of the substrate 302.

The next step of the process illustrated in FIG. 3A is to singulate the vias 316 into slivers 304 of vias 316. Any substrate remaining around the vias 316 of a sliver 304 may be ground down to expose the vias 316. As will be appreciated, although FIG. 3A illustrates a sliver 304 as having four vias 316, there may be any number of vias 316 on a sliver 304.

Next, as illustrated in FIG. 3B, the slivers 304 are rotated 90 degrees so that the vias 316 are oriented vertically instead of horizontally as they were when part of the substrate 302. The slivers 304 can then be embedded in a molding compound 360 to incorporate them into a device, such as an inductor device 300. In the example of FIG. 3B, a plurality of slivers 304 having a pair of vias 316 are embedded in a row in the molding compound 360 to form the inductor device 300. The pairs of vias 316 in the row of slivers 304 are coupled to each other by upper conductors 314 and lower conductors 318 (similar to upper conductors 214 and lower conductors 218). The inductor device 300 is conductively coupled to an electric circuit 350 (such as electric circuit 150 in FIG. 1), also embedded in the molding compound 360, by a conductor 354 (similar to conductor 154 in FIG. 1).

FIG. 3B further illustrates a cross-section of the molding compound 360 and the electric circuit 350 showing a pair of vias 316. As can be seen, the vias 316 are oriented perpendicular to the surface of the molding compound 360 and conductors 314 and 318, as compared to originally being oriented parallel to the surface of the substrate 302 before singulation. Thus, although the vias 316 are two-dimensionally plated onto the substrate 302, they are three-dimensionally embedded in the molding compound 360.

FIG. 4 illustrates a portion 400 of an exemplary inductor device, such as inductor device 300, according to at least one aspect of the disclosure. The portion 400 includes a number of pairs of vias 416 conductively coupled by upper conductors 414 and lower conductors 418 (similar to upper conductors 314 and lower conductors 318). As illustrated in FIG. 4, each via 416 is composed of a backside layer 422, a via 426, and a frontside layer 424. The backside layer 422 is the layer of the via 416 plated on the back surface of the substrate (not shown), such as substrate 302 in FIG. 3A, as discussed above with reference to FIG. 3A. Likewise, the frontside layer 424 is the layer of the via 416 plated on the front surface of the substrate, such as substrate 302 in FIG. 3A. The via 426 is formed by drilling or laser cutting through the substrate and filling the opening with the same conductive material as the layers 422 and 424. The via 426 may be drilled or cut through the substrate after either the backside layer 422 or the frontside layer 424 is plated onto the substrate.

Note, as used herein, the term "first two-dimensional conductive means" refers to either of the backside layer 422 or the frontside layer 424 and equivalents thereof, and the term "second two-dimensional conductive means" refers to the other of the backside layer 422 and the frontside layer 424 and equivalents thereof. The term "means for conductively coupling" refers to the via 426 and equivalents thereof.

Figure 5:
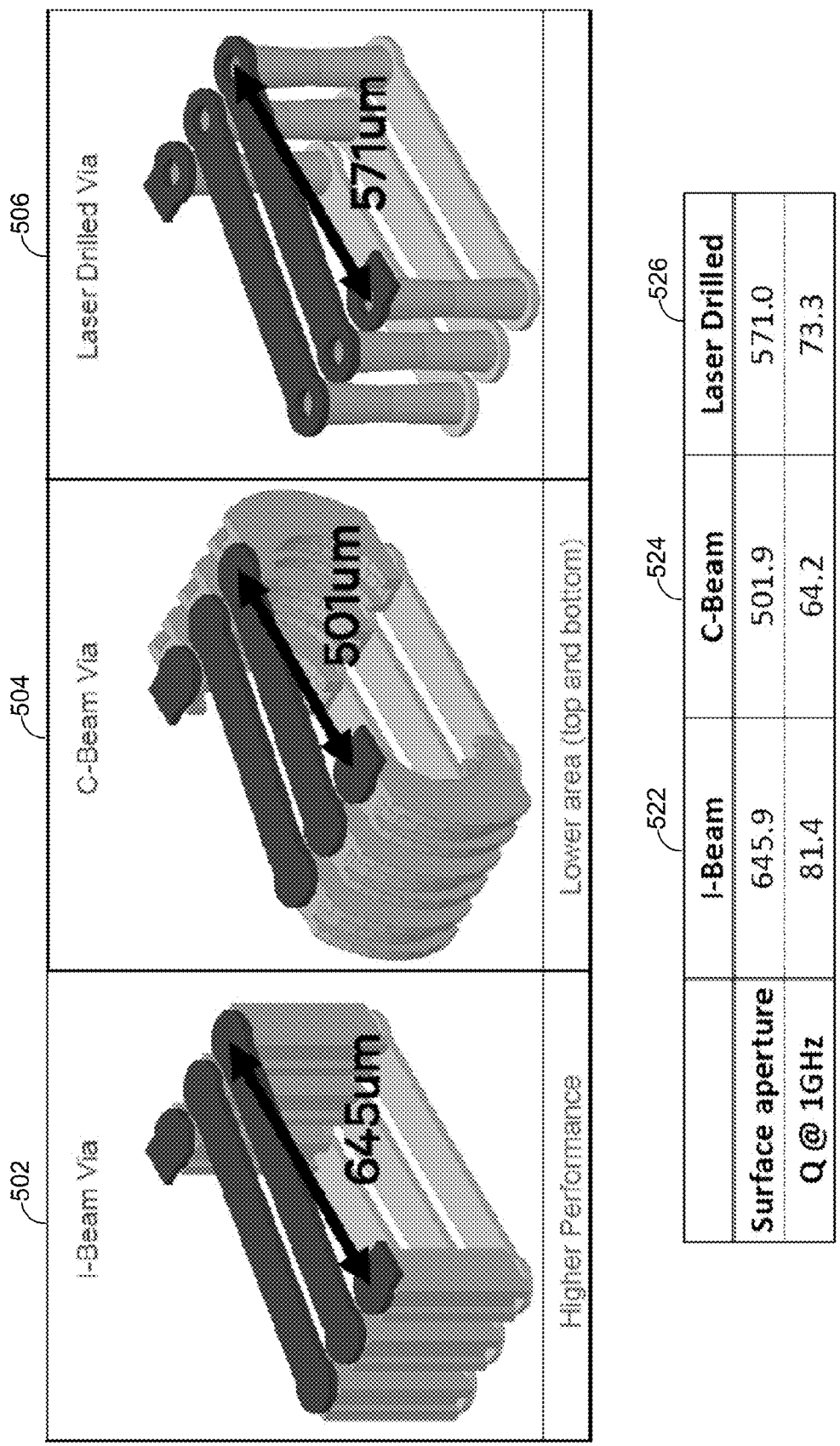
FIG. 5 illustrates a comparison of two exemplary inductor devices having vias according to an aspect of the disclosure to an inductor device having conventional vias.

FIG. 5 illustrates a comparison of two exemplary inductor devices having vias according to an aspect of the disclosure to an inductor device having conventional vias. Column 502 shows an exemplary inductor device having vias shaped like an I-beam (referred to as an "I-beam via"). As will be appreciated, the I-beam shape is created by the process of plating the backside layer of the I-beam via and the frontside layer of the I-beam via on either side of a substrate and connecting them with a correspondingly shaped via, as illustrated in FIGS. 3A and 4. As shown in column 502, the distance between the two sets of I-beam vias is 645 μm. As shown in column 522, the surface aperture of this inductor device is 645.9 μm and the Q-factor is 81.4 at 1 GHz. The "surface aperture" corresponds to the length of the conductors between the pairs of vias.

Column 504 shows an exemplary inductor device having vias shaped like a C-beam (referred to as a "C-beam via"). Like the I-beam via, the C-beam shape is created by the process of plating the backside layer of the C-beam via and the frontside layer of the C-beam via on either side of a substrate and connecting them with a correspondingly shaped via, as illustrated in FIGS. 3A and 4. As shown in column 504, the distance between the two sets of C-beam vias is 501 μm. As shown in column 524, the surface aperture of this inductor device is 501.9 μm and the Q-factor is 64.2 at 1 GHz.

Column 506 shows an exemplary inductor device having conventional laser cut (or drilled) vias. As shown in column 506, the distance between the two sets of vias is 571 μm. As shown in column 526, the surface aperture of this inductor device is 571 μm and the Q-factor is 73.3 at 1 GHz.

As shown in FIG. 5, the inductor device illustrated in column 502 provides higher performance (i.e., a higher Q-factor) than the conventional inductor device shown in column 506. Although the inductor device illustrated in column 504 has a lower Q-factor than the conventional inductor device, it has a smaller area on the surface of the molding compound than the conventional inductor device. This smaller surface area allows more space for other components to be layered on the surface of the molding compound.

Figure 6:
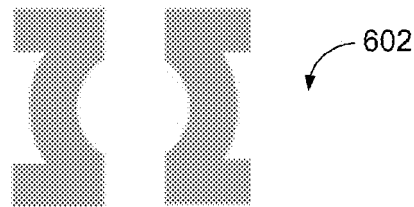
FIG. 6 illustrates additional shapes the vias of the present disclosure may take.
Figure 6:
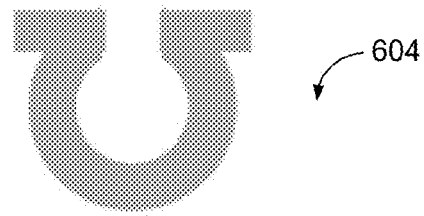

FIG. 6 illustrates additional shapes the vias of the present disclosure may take. In the example of FIG. 6, the pair of vias 602 form a circular two-sided interconnect, similar to the pairs of vias illustrated in FIGS. 3A and 3B. In contrast, the via 604 is shaped to form a circular one-sided interconnect.

Figure 7:
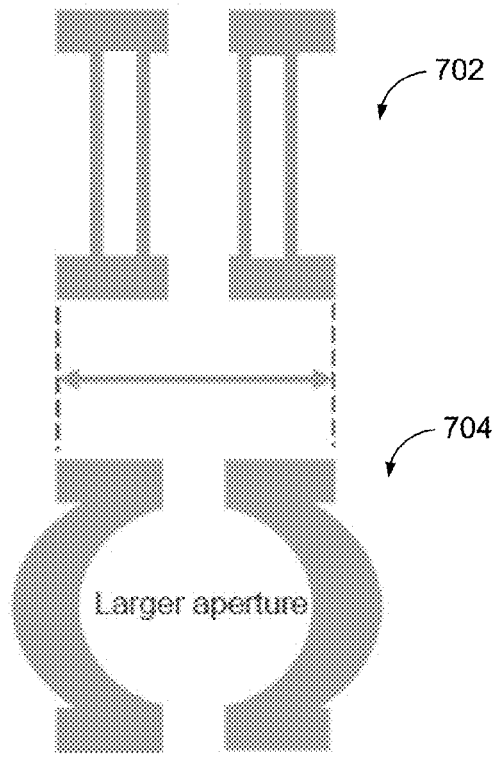
FIG. 7 illustrates another example of how an interconnect having vias according to the present disclosure can be utilized to take up the same amount of surface space on the mold compound as a conventional interconnect while providing a larger aperture between the vias for, for example, the magnetic core of an inductor device.

FIG. 7 illustrates another example of how an interconnect 704 having vias according to the present disclosure can be utilized to take up the same amount of surface space on the mold compound as a conventional interconnect 702, while providing a larger aperture between the vias for, for example, the magnetic core of an inductor device. Similar to the cross-section 210B in FIG. 2, the curved vias of interconnect 704 form a curved aperture through the substrate (not shown). The additional conductive material of the vias of the interconnect 704 compared to the vias of the interconnect 702 (due to the curve of the vias) increases the efficiency of the inductor device. In addition, as illustrated by the dashed lines in FIG. 7, the vias of the interconnect 704 form a larger aperture in the substrate for the magnetic core of the inductor device without taking up more space on the surface of the substrate.

Figure 8:
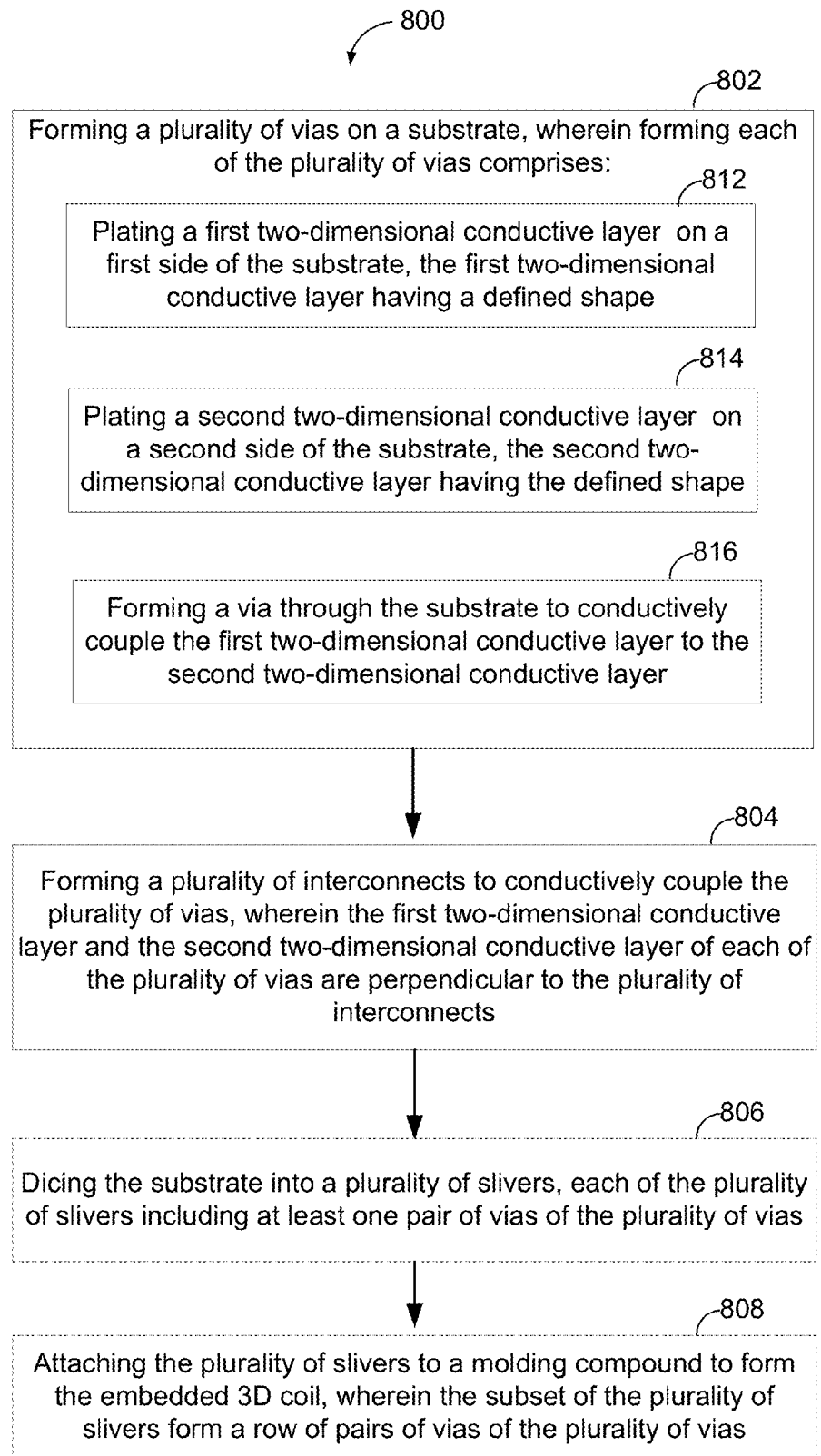
FIG. 8 illustrates an exemplary flow for forming an embedded three-dimensional (3D) coil, such as an inductor device, according to at least one aspect of the disclosure.

FIG. 8 illustrates an exemplary flow 800 for forming an embedded three-dimensional (3D) coil, such as an inductor device, according to at least one aspect of the disclosure.

At 802, the flow 800 includes forming a plurality of vias on a substrate, such as substrate 302 in FIG. 3A. Forming each of the plurality of vias at 802 includes plating, at 812, a first two-dimensional conductive layer, such as backside 422 in FIG. 4, on a first side of the substrate, the first two-dimensional conductive layer having a defined shape, as described above with reference to FIG. 3A. Forming each of the plurality of vias at 802 further includes plating, at 814, a second two-dimensional conductive layer, such as frontside layer 424 in FIG. 4, on a second side of the substrate, the second two-dimensional conductive layer having the defined shape, as described above with reference to FIG. 3A. Subsequently, at 814, forming each of the plurality of vias at 802 includes forming a via, such as via 426 in FIG. 4, through the substrate to conductively couple the first two-dimensional conductive layer to the second two-dimensional conductive layer.

At 804, the flow 800 includes forming a plurality of interconnects, such as upper conductors 314 and lower conductors 318 in FIG. 3B and upper conductors 414 and lower conductors 418 in FIG. 4, to conductively couple the plurality of vias. The plurality of interconnects may conductively couple the pairs of vias of the plurality of vias. As illustrated in FIG. 4, for example, the first two-dimensional conductive layer and the second two-dimensional conductive layer of each of the plurality of vias may be perpendicular to the plurality of interconnects.

At 806, the flow 800 optionally includes dicing the substrate into a plurality of slivers, such as slivers 304 in FIG. 3B, each of the plurality of slivers including at least one pair of vias of the plurality of vias, as discussed above with reference to FIG. 3B. Although illustrated as occurring after operation 804, operation 806 may occur before operation 804, as illustrated in FIG. 3B.

At 808, the flow 800 optionally includes attaching the plurality of slivers to a molding compound to form the embedded 3D coil, where the subset of the plurality of slivers form a row of pairs of vias of the plurality of vias, as described above with reference to FIG. 3B.

Although not illustrated in FIG. 8, the flow 800 may further include forming a magnetic core of the embedded 3D coil within an aperture defined by the pairs of vias of the plurality of vias.

In an aspect, the defined shape may be a curved shape. In that case, the length of the plurality of interconnects may be less than the length of a second plurality of interconnects conductively coupling a second plurality of vias of a second inductor device, where the second plurality of vias do not have the curved shape, as discussed above with reference to FIG. 7.

In an aspect, the defined shape may be an "I" shape, as illustrated in column 502 of FIG. 5. In this case, a quality factor of the inductor device may be greater than a second quality factor of a second inductor device, where a second plurality of vias of the second inductor device are drilled or cut vias, as illustrated in column 506 of FIG. 5.

In an aspect, the defined shape may be a "C" shape, as illustrated in column 504 of FIG. 5.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus, comprising:
a plurality of vias each having a defined shape, wherein each of the plurality of vias comprises:
a first two-dimensional conductive layer plated on a first side of a substrate, the first two-dimensional conductive layer having the defined shape,
a second two-dimensional conductive layer plated on a second side of the substrate, the second two-dimensional conductive layer having the defined shape, and
a via conductively coupling the first two-dimensional conductive layer to the second two-dimensional conductive layer; and
a plurality of interconnects configured to conductively couple the plurality of vias, wherein the first two-dimensional conductive layer and the second two-dimensional conductive layer of each of the plurality of vias are perpendicular to the plurality of interconnects.

2. The apparatus of claim 1, wherein the apparatus comprises an inductor device.

3. The apparatus of claim 2, wherein the defined shape is a curved shape.

4. The apparatus of claim 3, further comprising a magnetic core of the inductor device within an aperture defined by the curved shape of the plurality of vias.

5. The apparatus of claim 2, wherein the defined shape is an "I" shape.

6. The apparatus of claim 1, wherein the defined shape is a "C" shape.

7. The apparatus of claim 1, wherein the defined shape is a semicircle shape.

8. The apparatus of claim 1, wherein the apparatus comprises an embedded three-dimensional (3D) coil.

9. The apparatus of claim 1, wherein the via directly couples the first two-dimensional conductive layer to the second two-dimensional conductive layer.

10. The apparatus of claim 1, wherein the via substantially matches the defined shape.

11. The apparatus of claim 10, wherein the defined shape is one of a "C" shape or a semicircle shape.

12. The apparatus of claim 1, wherein the first two-dimensional conductive layer and the second two-dimensional conductive layer are parallel to each other.

13. The apparatus of claim 12, wherein a first portion of the first two-dimensional conductive layer is coplanar with a second portion of the second two-dimensional conductive layer.

14. The apparatus of claim 13, wherein the first portion and the second portion are separated by the via.

15. An apparatus, comprising:
   a plurality of vias each having a defined shape, wherein each of the plurality of vias comprises:
      a first two-dimensional conductive means plated on a first side of a substrate, the first two-dimensional conductive means having the defined shape,
      a second two-dimensional conductive means plated on a second side of the substrate, the second two-dimensional conductive means having the defined shape, and
      means for conductively coupling the first two-dimensional conductive means to the second two-dimensional conductive means; and
   a plurality of interconnects configured to conductively couple the plurality of vias, wherein the first two-dimensional conductive means and the second two-dimensional conductive means of each of the plurality of vias are perpendicular to the plurality of interconnects.

16. The apparatus of claim 15, wherein the apparatus comprises an inductor device.

17. The apparatus of claim 16, wherein the defined shape is a curved shape.

18. The apparatus of claim 17, further comprising a magnetic core of the inductor device within an aperture defined by the curved shape of the plurality of vias.

19. The apparatus of claim 16, wherein the defined shape is an "I" shape.

20. The apparatus of claim 15, wherein the defined shape is a "C" shape.

21. The apparatus of claim 15, wherein the apparatus comprises an embedded three-dimensional (3D) coil.

* * * * *